(12) United States Patent
Feigelson et al.

(10) Patent No.: US 12,237,169 B2
(45) Date of Patent: Feb. 25, 2025

(54) WBG AND UWBG SEMICONDUCTOR WITH P- AND N-TYPE CONDUCTIVITY AND PROCESS FOR MAKING THE SAME

(71) Applicant: The Government of the United States of America, as Represented by the Secretary of the Navy, Arlington, VA (US)

(72) Inventors: Boris N. Feigelson, Springfield, VA (US); Alan G. Jacobs, Rockville, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 361 days.

(21) Appl. No.: 17/714,204

(22) Filed: Apr. 6, 2022

(65) Prior Publication Data

US 2023/0197454 A1 Jun. 22, 2023

Related U.S. Application Data

(60) Provisional application No. 63/172,965, filed on Apr. 9, 2021.

(51) Int. Cl.
*H01L 21/00* (2006.01)
*H01L 21/265* (2006.01)
(Continued)

(52) U.S. Cl.
CPC .... *H01L 21/26546* (2013.01); *H01L 29/2003* (2013.01); *H01L 29/207* (2013.01); *H01L 29/24* (2013.01)

(58) Field of Classification Search
CPC .......... H01L 21/26546; H01L 29/2003; H01L 29/207; H01L 29/24
See application file for complete search history.

(56) References Cited

U.S. PATENT DOCUMENTS

| 5,981,342 A | * | 11/1999 | Kakoschke | ....... H01L 29/66825 438/266 |
| 8,518,808 B2 | | 8/2013 | Feigelson et al. | |

(Continued)

OTHER PUBLICATIONS

B. J. Baliga, "Semiconductors for high-voltage, vertical channel field-effect transistors," J. Appl. Phys. 53, 1759 (1982).
(Continued)

*Primary Examiner* — Richard A Booth
(74) *Attorney, Agent, or Firm* — US Naval Research Laboratory; Joslyn J. Barritt

(57) ABSTRACT

Methods for efficient doping of wide-bandgap (WBG) and ultrawide-bandgap (UWBG) semiconductors by implantation, and WBG and UWBG semiconductors made using the disclosed methods. A p-type semiconductor region is formed by implanting specified acceptor and donor co-dopant atoms in a predetermined ratio, e.g., two acceptors to one donor (ADA), into the semiconductor lattice. An n-type type semiconductor region is by implanting specified donor and acceptor co-dopant atoms in a predetermined ratio, e.g., two donors to one acceptor (DAD), into the semiconductor lattice. Compensator atoms are also implanted into the lattice to complete formula units in the crystal lattice structure and preserve the stoichiometry of the semiconductor material. The doped material is then annealed to activate the dopants and repair any damage to the lattice that might have occurred during implantation.

14 Claims, 3 Drawing Sheets

(51) Int. Cl.
    *H01L 29/20*     (2006.01)
    *H01L 29/207*     (2006.01)
    *H01L 29/24*     (2006.01)

(56) References Cited

U.S. PATENT DOCUMENTS

| | | |
|---|---|---|
| 9,543,168 B2 | 1/2017 | Feigelson et al. |
| 10,854,457 B2 | 12/2020 | Feigelson et al. |
| 2005/0062103 A1* | 3/2005 | Chen .................. H01L 29/6659 257/E21.345 |

OTHER PUBLICATIONS

M. B. Maccioni et al., "Phase diagram and polarization of stable phases of (Ga1 xlnx)2O3," Appl. Phys. Express 9, 041102 (2016).

J. L. Lyons, "A survey of acceptor dopants for β Ga2O3," Semicond. Sci. Technol. 33, 05LT02 (2018).

A. Krystos et al., "On the feasibility of p type Ga2O3," Appl. Phys. Lett. 112, 032108 (2018).

\* cited by examiner

WBG AND UWBG SEMICONDUCTOR WITH P- AND N-TYPE CONDUCTIVITY AND PROCESS FOR MAKING THE SAME

CROSS-REFERENCE

This Application is a Nonprovisional of and claims the benefit of priority under 35 U.S.C. § 119 based on U.S. Provisional Patent Application No. 63/172,965 filed on Apr. 9, 2021. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #210244.

TECHNICAL FIELD

The present disclosure relates to wide-bandgap and ultra-wide-bandgap semiconductors and processes for forming the same.

BACKGROUND

Compact high power systems such as high efficiency power switches, radio frequency devices, and converters that can handle high power density require wide-bandgap (WBG) and ultrawide-bandgap (UWBG) semiconductors and devices with vertical architecture.

To be efficient, these type of devices need to exploit p-n junctions and selective area doping.

For example, sufficient p- and n-type doping of gallium nitride (GaN) during growth has been accomplished, but the challenge of forming reliable and high-performance p-n junctions in selective lateral areas in GaN (and other nitrides) limits applications, especially vertical power transistors. The viable GaN selective area doping that yields material of sufficiently high quality to enable defect-free p-n junctions must be accomplished before the advantages of these vertical GaN power devices can be fully utilized.

Even though there is still substantial room for development of WBG materials such as GaN and its alloys and for devices based on such WBG materials, one potential approach to achieving the next level of improvement for future power handling capability and cost requirements involves using a material from the emerging class of UWBG semiconductors such as gallium oxide ($Ga_2O_3$), aluminum nitride (AlN), cubic boron nitride (c-BN), and diamond.

With a bandgap of 4.9 eV, $Ga_2O_3$ is a material that shows promise as an UWBG semiconductor. Baliga's figure of merit (BFOM) is the measure of power losses in the semiconductor, wherein a higher BFOM means lower loss, and is widely used to evaluate the suitability of semiconductor materials for power electronics. Among currently explored materials in the literature, $Ga_2O_3$ has a theoretical breakdown voltage of 8 MV/cm, with a BFOM that is 4 times larger than that of GaN and 14 times that of 4H—SiC. See B. J. Baliga, "Semiconductors for high-voltage, vertical channel field-effect transistors," *J. Appl. Phys.* 53, 1759 (1982). As a result, $Ga_2O_3$ is expected to have lower resistive and switching losses than 4H—SiC and GaN. In addition, due to its a larger dielectric constant, the critical field of $Ga_2O_3$ is larger than that of Si for the same doping level, and consequently, at a given doping level, the thickness of the drift region of $Ga_2O_3$ is 27 times smaller than that of Si, which results in $Ga_2O_3$ having a higher power density capability. The Johnson's figure of merit of $Ga_2O_3$, which measures the suitability of high frequency operation of semiconductor materials, is about 6 and 15 times larger than that of GaN and SiC, respectively, which also makes it appealing for higher power RF applications. Thus, $Ga_2O_3$ is a compelling material candidate for next generation power device technologies.

AlN is also an attractive material for high-temperature and high-power applications due to its high critical electric field (Ec), high thermal conductivity of 320 $Wm^{-1}K^{-1}$ at room temperature, and a band-gap energy of 6.1 eV. See M. B. Maccioni et al., "Phase diagram and polarization of stable phases of $(Ga_{1-x}In_x)_2O_3$," 2016 *Appl. Phys. Express* 9 041102. Baliga's FOM of AlN ($=1.5\times10^4$) is more than one order of magnitude higher than that of SiC ($=3.4\times10^2$) or GaN ($=1.5\times10^3$) primarily due to the high Ec in AlN.

Although there has been some success in n-type doping of these UWBG semiconductors, challenges with such doping remain. Silicon, which has a small thermal activation energy of about 50 meV, acts as a reasonably shallow donor in $Ga_2O_3$. The n-type conductivity of $Ga_2O_3$ is easily tunable over many orders of magnitude; however, in order to further extend its utility and applications, it is necessary to realize p-type $Ga_2O_3$. There has been no report on successful shallow acceptor doping and hole conduction in $Ga_2O_3$, even though p-type doping could in theory be realized by substituting either group-II (Be, Zn, and Mg) elements for Ga sites or group-V elements (N, P, and As) for O sites. See J. L. Lyons, "A survey of acceptor dopants for $\beta$-$Ga_2O_3$," 2018 *Semicond. Sci. Technol.* 33 05LT02, Silicon implantation has been established as an effective doping technique for $Ga_2O_3$ and a powerful tool in the fabrication of not only the ohmic contacts but also the channel region of lateral FETs. Development of ion implantation processes for other elements is especially useful for forming edge-termination structures in high-voltage vertical devices and highly valuable for expanding the design freedom of device structures in general.

In contrast to the successful n-type doping of $Ga_2O_3$, doping of AlN to produce low resistivity n-type and p-type material has proven to be difficult. Although n-type AlN can be formed by silicon doping, it usually exhibits low conductivity, often due to the electronic levels of intrinsic defects or contaminant impurities. Incorporation of magnesium usually allows formation of p-type AlN, but its large ionization energy (~0.5 eV) leads to minimal activation at room temperature. Due to these difficulties, traditional doping techniques are not expected to produce p-type $Ga_2O_3$, and p- and n-type AlN with reasonably high carrier concentration. See A. Krystos et al., "On the feasibility of p-type $Ga_2O_3$," *Appl. Phys. Lett.* 112, 032108 (2018).

In addition, selective area doping of WBG and UWBG semiconductors requires techniques more efficient than selective regrowth approaches.

Deep energy levels of the acceptors or/and donors in the WBG and UWBG semiconductors make fabrication of both low-resistivity p- and n-type regions in these materials difficult. For instance, development of blue-ultraviolet lasers and high-power electronics devices using GaN, AlN, or diamond has been hampered by the high resistivity of p-type GaN, p-type and n-type AlN, and n-type diamond.

In order to fabricate the low-resistivity wide band-gap semiconductor, the energy level of the acceptor or donor dopants should be reduced to increase the number of the carriers generated for each dopant. In addition, the solubility of the dopant should be large to avoid a compensation by deep impurity levels and avoid a reduction of available dopants by phase segregation.

One of the possible ways to increase the dopant solubility, increase the activation rate by lowering the ionization energy of acceptors or donors, and increase the carrier concentration and mobility is by co-doping of WBG and UWBG semiconductors. Co-doping allows the formation of different donor-acceptor complexes, which can decrease the formation energy of dopants due to reduction of the lattice relaxation energy and at the same time increase p- or n-type conductivity. In co-doping, donor and acceptor atoms can be incorporated in an acceptor-donor-acceptor (ADA) scheme, where more acceptors than donors are introduced in order to implement p-type doping or in a donor-acceptor-donor (DAD) scheme, where more donors than acceptors are introduced in order to implement n-type doping.

For instance, formation of an acceptor-donor-acceptor (ADA) complex can decrease the acceptor ionization energy by lowering the acceptor level toward the valence band edge for more efficient p-type doping. If a donor-acceptor-donor (DAD) complex is formed, the donor level can be raised toward the conduction band edge, thereby reducing the donor ionization energy and producing more efficient n-type doping. The shift of the dopant state toward the band edges is due to the formation of the bonding and anti-bonding like states and leading to a greater carrier density and improved conductivity. In order to form such ADA or DAD complexes, the atoms in the semiconductor lattice must be within close proximity such that they interact electrically and form p- or n-type dopant states near the band edge.

However, these or similar co-doping schemes require precise ratios between different dopants in WBG and UWBG semiconductors and, as a result are not practically accessible during growth because different impurities have different incorporation rates in different crystal faces.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods for creating efficient p and n-type conductivity in wide-bandgap (WBG) and ultrawide-bandgap (UWBG) semiconductors such as GaN, AlN, cubic BN and alloys thereof, as well as $Ga_2O_3$ and diamond.

The doping methods in accordance with the present invention can be used to form p-type semiconductor regions, n-type semiconductor regions, and p-n junctions in these semiconductors by means of co-doping the semiconductor material by multiple ion implantations.

In accordance with the present invention, a p-type semiconductor region can be formed in a binary $A_xB_y$ WBG or UWBG semiconductor sample by implanting specified acceptor and donor co-dopant atoms at a ratio between acceptor and donor of greater than 1:1, e.g., a 2:1 ratio of two acceptors to one donor (ADA), into the semiconductor lattice. In addition, specified amounts of compensator atoms are also implanted into the lattice, wherein the compensator atoms preserve the stoichiometry of the semiconductor material.

In accordance with the present invention, an n-type type semiconductor region can be formed in a binary $A_xB_y$ WBG or UWBG semiconductor sample by implanting specified donor and acceptor co-dopant atoms at a ratio between donor and acceptor of greater than 1:1, e.g., a 2:1 ratio of two donors to one acceptor (DAD) into the semiconductor lattice. In addition, specified amounts of compensator atoms are also implanted into the lattice, wherein the compensator atoms preserve the stoichiometry of the semiconductor material.

In accordance with the present invention, a p-n junction can be formed in a binary $A_xB_y$ WBG or UWBG semiconductor sample by implanting specified acceptor and donor atoms at a ratio greater than 1:1, e.g., a 2:1 ratio of two acceptors to one donor (ADA), in one region of a semiconductor sample and implanting specified donor and acceptor atoms at a ratio greater than one, e.g., a 2:1 ratio of two donors to one acceptor (DAD), in a second, adjacent region of the semiconductor sample, and further implanting specified amounts of compensator atoms in both the first and second regions of the semiconductor sample, wherein the compensator atoms preserve the stoichiometry of the semiconductor material.

As implanted, dopants are incorporated in random locations, resulting in isolated species that randomly occupy a lattice site or sit interstitially surrounded by lattice defects, such as vacancies or interstitials, formed during implantation. However, annealing the implanted material allows the dopant and compensator atoms to move the implanted species onto the lattice so that the implanted species become electrically active. In the case of ADA or DAD co-doping implantation, annealing allows atoms to move co-implanted species closely together so that they form electrically active ADA or DAD complexes, in which the atoms are within close proximity such that they interact electrically and form p- or n-type dopant states near the band edge.

After the ADA and/or DAD co-dopants and compensator atoms are implanted, the semiconductor is annealed to activate the dopants and repair any damage to the semiconductor lattice that might have occurred during the implantation.

The resulting doped WBG or UWBG semiconductor can be used to make electronic and optoelectronic devices requiring p-type semiconductor regions, n-type semiconductor regions, and/or p-n junctions in those semiconductors.

These and other aspects of this invention can be accomplished by the new process of doping described in details in the disclosure of this invention.

DETAILED DESCRIPTION

Figures 1A, 1B:
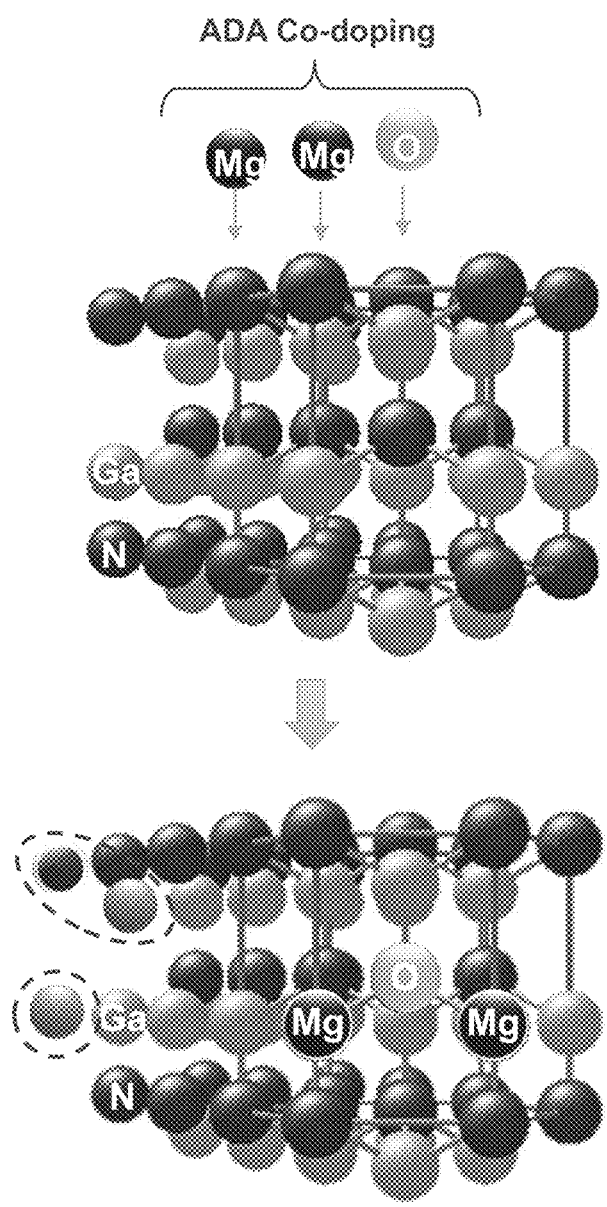
FIGS. 1A-1B are block schematics illustrating aspects of exemplary acceptor-donor-acceptor (ADA) doping of gallium nitride (GaN) by implantation in accordance with the prior art.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides methods for implanting and activating donor and acceptor dopants in wide-bandgap (WBG) and ultrawide-bandgap (UWBG) semiconductors such as GaN, AlN, cubic BN and alloys thereof, as well as $Ga_2O_3$ and diamond.

The doping methods in accordance with the present invention can be used to form p-type semiconductor regions, n-type semiconductor regions, and/or p-n junctions in these semiconductors by means of doping by multiple ion implantations.

As described in more detail below, in one embodiment in accordance with the present invention, a p-type semiconductor region can be formed in a binary $A_xB_y$ WBG or UWBG semiconductor sample by implanting specified acceptor or acceptor/donor atoms at a ratio of more than 1:1, e.g., by applying an ADA doping scheme of two acceptors to one donor, to create a p-type area in the sample. In addition, in accordance with the present invention, specified amounts of compensator atoms are also implanted into the semiconductor lattice, wherein the compensator atoms preserve the stoichiometry of the semiconductor material.

In another embodiment in accordance with the present invention, an n-type type semiconductor region can be formed in a binary $A_xB_y$ WBG or UWBG semiconductor sample by implanting specified donor or donor/acceptor atoms at a ratio of more than 1:1, e.g., by applying a DAD doping scheme of two donors to one acceptor, to create a n-type area in the sample. In addition, in accordance with the present invention, specified amounts of compensator atoms are also implanted into the semiconductor lattice, wherein the compensator atoms preserve the stoichiometry of the semiconductor material.

In another embodiment in accordance with the present invention, a p-n junction can be formed in a binary $A_xB_y$ WBG or UWBG semiconductor sample by implanting specified acceptor and donor atoms at a ratio of more than 1:1, e.g., at ratio of two acceptors to one donor (ADA) in one region of a semiconductor sample and implanting specified donor and acceptor atoms at a ratio of more than 1:1, e.g., at a ratio of two donors to one acceptor (DAD) in a second, adjacent region of the semiconductor sample, and further implanting specified amounts of compensator atoms in both the first and second regions of the semiconductor sample, wherein the compensator atoms preserve the stoichiometry of the semiconductor material.

After the ADA and/or DAD co-dopants and compensator atoms are implanted, the semiconductor is annealed to activate the dopants and repair any damage to the semiconductor lattice that might have occurred during the implantation. Activation happens by moving implanted atoms during annealing onto known substitutional lattice sites.

The resulting doped WBG or UWBG semiconductor can be used to make electronic and optoelectronic devices requiring p-type semiconductor regions, n-type semiconductor regions, and/or p-n junctions.

These and other aspects of this invention can be accomplished by the new process of doping described in more detail below.

As noted above, co-doping of semiconductors, more specifically ADA and DAD co-doping to create p- and n-type regions in WBG and UWBG semiconductors during growth, is often problematic because it is difficult to maintain a specific ratio between acceptors and donors and the dopants can occupy random sites in the semiconductor lattice, resulting in mid-gap states, trap states, or deep states, all of which reduce the resultant carrier concentration and greatly reduce carrier mobility.

The present invention provides a method for overcoming these issues of co-doping with precise ratio between co-dopants in general, and more specifically in ADA and DAD co-doping of the WBG and UWBG semiconductors, and to create p and n-type areas in these materials with high electrical conductivity, a process described in this disclosure is applied.

The method of the present invention consists of a two-phase process.

In the first phase, acceptor and donor dopant atoms are implanted into a WBG or UWBG sample in a predetermined ratio, e.g., using an ADA doping scheme in which two acceptors are implanted for each donor to create a predetermined p-type area in the sample or in a predetermined ratio, e.g., using a DAD doping scheme with two donors for each acceptor to create a predetermined n-type area in the sample.

However, as noted above, if ADA co-doping is conducted by implantation with precise required ratio between acceptors and donors, they substitute atoms that naturally sit on the metal and nonmetal sublattices, resulting in a stoichiometric imbalance between substituted atoms leading to an excess of either interstitials or vacancies. For example, in ADA doping of GaN using Mg and O by implantation as shown in FIG. 1A, after annealing, the two implanted Mg atoms substitute two Ga atoms on the metal sublattice and the one implanted O atom substitutes N on the nonmetal sublattice. Since there are two Mg atoms added for every one O, either one Ga atom must sit interstitially or one N vacancy must be generated on the nitrogen sublattice to compensate for this imbalance, as shown in FIG. 1B. In the case of ADA doping of GaN using Mg and Si atoms, both Mg and Si sit on the gallium sublattice and thus either three Ga atoms (per ADA) must be sitting interstitially or three vacancies on the nitrogen sublattice must be generated. As stated above, any interstitials or vacancies greatly reduce the carrier mobility and can act as traps or mid-gap states.

To resolve the imbalance, in accordance with the present invention, in addition to the acceptor and donor atoms, a specified number of compensator atoms are also implanted into the sample, wherein the compensator atoms preserve the stoichiometry or reduce non-stoichiometry of the semiconductor material.

For example, as described in more detail below, GaN can be doped p-type using an ADA scheme by implanting magnesium, oxygen, and nitrogen wherein the magnesium is the acceptor species, oxygen is the donor species, and nitrogen is the compensator species. In other exemplary cases, AlN can be doped n-type using a DAD scheme by implanting silicon, beryllium, and nitrogen wherein the silicon is the donor species, beryllium is the acceptor species, and nitrogen is the compensator species, or doped p-type using an ADA scheme, where beryllium is the donor, silicon is the acceptor, and nitrogen is the compensator.

In the second phase of a method for co-doping a WBG or UWBG semiconductor material in accordance with the present invention, the thus-implanted sample is annealed to activate the implanted dopants and repair any damage to the semiconductor lattice that may have been caused by the implantation process. In many cases, annealing may be preferably accomplished using the multicycle rapid thermal annealing (MRTA) or symmetric multicycle rapid thermal annealing (SMRTA) processes described below. Transient annealing methods such as MRTA and SMRTA may be particularly advantageous since they can set up a non-equilibrium state in the material which promotes formation of dopant complexes in accordance with the present invention, but any suitable annealing process can be used, and all such annealing processes are deemed to be encompassed within the scope of the method of the present invention.

The energy profile of the implanted acceptor, donor and compensating impurity atoms depends on the specific WBG or UWBG semiconductor, the implanted elements, and the designed distribution of the implanted elements in the semiconductor.

For example, the ADA type of co-doping requires that the concentration of acceptor impurities be two times larger than the concentration of donor impurities for every elemental volume in the semiconductor. In the case of a pure, stoichiometric, intrinsic semiconductor which doesn't have p- or n-type doping, an implantation dose of an acceptor species should be two times larger than the donor species dose for every elemental volume in the semiconductor.

On the other hand, if the semiconductor has a known concentration of acceptors or donors before implantation of the dopants in, for example, an ADA co-doping scheme in accordance with the method of the present invention, total doses of the implanted acceptors and donors can be determined by a final ratio of dopant concentration wherein the total number of acceptor atoms is twice the total number of donor atoms within each elemental volume.

Similarly, the DAD type of co-doping requires that the concentration of donor impurities be two times larger than the concentration of acceptor impurities for every elemental volume in the semiconductor.

In the case of a pure, stoichiometric, intrinsic semiconductor which doesn't have p- or n-type doping an implantation, dose of donor species should be two times larger than the acceptor species dose for every elemental volume in the semiconductor.

On the other hand, if the semiconductor has a known concentration of acceptors or donors before implantation of the dopants in, for example, a DAD co-doping scheme in accordance with the method of the present invention, total doses of the implanted acceptors and donors can be determined by a final ratio of dopant concentration wherein the total number of donor atoms is twice the total number of acceptor atoms.

As noted above, however, such co-doping schemes result in formation of excess interstitial and vacancy populations after the material is annealed, as shown in FIG. 1B.

To overcome these drawbacks resulting from ADA and DAD co-doping by implantation, in accordance with the present invention, additional compensating impurity atoms are also implanted into the material to add complete formula units to the lattice via ion implantation and maintain the stoichiometry of the semiconductor material in conjunction with the material's starting stoichiometry.

Figure 2A:
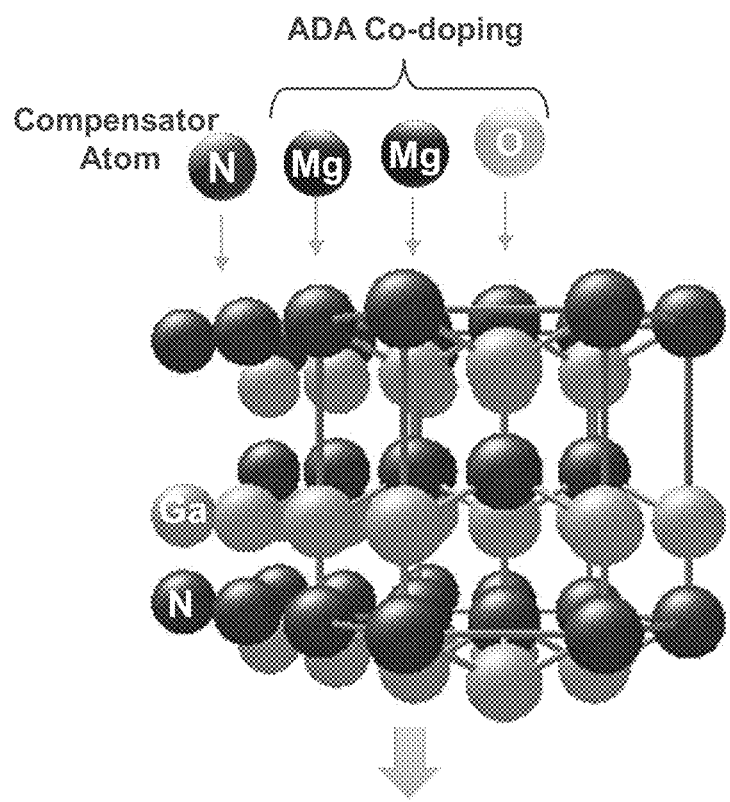
FIGS. 2A and 2B are block schematics illustrating aspects of exemplary acceptor-donor-acceptor (ADA) doping of gallium nitride (GaN) in accordance with the present invention.
Figure 2B:
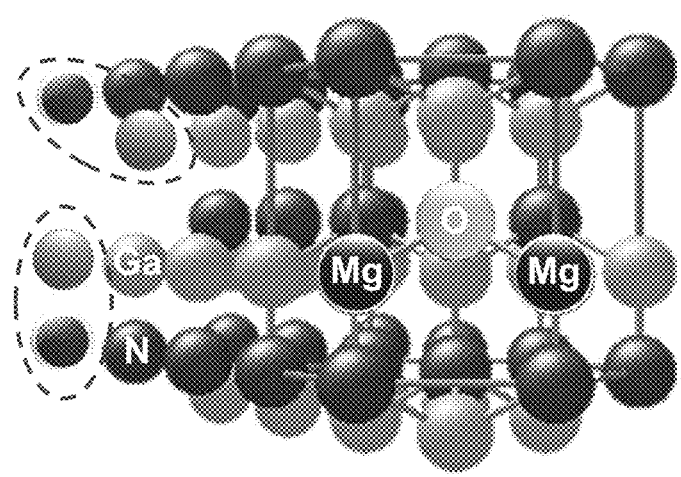

In an exemplary embodiment, illustrated by the block schematics in in FIGS. 2A and 2B, GaN can be doped p-type using an ADA scheme by implanting magnesium, oxygen, and nitrogen wherein the magnesium is the acceptor species, oxygen is the donor species, and nitrogen is the compensator species. However, one skilled in the art will readily understand that the doping scheme described herein can readily be modified to form n-type areas in GaN by means of DAD co-doping or using ADA or DAD co-doping of other binary semiconductor materials such as GaN, AlN, or $Ga_2O_3$. For example, in other embodiments, AlN may be doped p-type (ADA) or n-type (DAD) using beryllium, silicon, and nitrogen, where p-type doping may be accomplished using the ratio of two beryllium atoms to one silicon atom, with three nitrogen atoms as compensator atoms, and n-type doping being done using two silicon atoms to one beryllium, plus three nitrogen atoms as compensator.

Thus, as illustrated in FIG. 2A, GaN can be ADA co-doped by implantation of two magnesium (Mg) atoms for each oxygen (O) atom.

However, as noted above, in such ADA co-doping, the different ratio of atoms that naturally sit on the metal and nonmetal sublattices, i.e., Mg on the gallium lattice and O on the nitrogen lattice, results in an imbalance leading to an excess of either interstitials or vacancies. Since there are two Mg added for every one O, either one metal must sit interstitially, or one vacancy must be generated on the nitrogen sublattice, as discussed above with respect to FIG. 1B. In the case of ADA co-doping of GaN with Mg and Si, both Mg and Si sit on the gallium sublattice and thus either three metal atoms (per ADA) must be sitting interstitially (whether Ga atoms, Mg atoms, or Si atoms) or three vacancies on the nitrogen sublattice must be generated. As stated above, any interstitials or vacancies greatly reduce the carrier mobility and can act as traps or mid-gap states.

The present invention solves this problem by further doping with compensating impurity atoms such as the additional N atom as shown in FIGS. 2A and 2B in a manner described in more detail below. These compensating atoms re-balance the stoichiometry that was perturbed by the additional implanted atoms and fill any vacancies or capture any interstitial atoms that might be present.

In the second phase of the method for forming a p- or n-type regions in accordance with the present invention, the thus-implanted semiconductor sample is annealed to activate the dopants and repair any damage to the semiconductor lattice that may have been caused by the implantation process. In many cases, annealing may be preferably accomplished using the multicycle rapid thermal annealing (MRTA) or symmetric multicycle rapid thermal annealing (SMRTA) processes described below. As noted above, transient annealing methods such as MRTA and SMRTA may be particularly advantageous since they can set up a non-equilibrium state in the material which promotes formation of dopant complexes in accordance with the present invention, but any suitable annealing process can be used, and all such annealing processes are deemed to be encompassed within the scope of the method of the present invention The type and dose of the compensating impurity atoms depends on the type and stoichiometry of the original WBG or UWBG semiconductor and which element in the compound semiconductor will be substituted by the implanted dopants.

In the case of a binary $A_xB_y$ WBG or UWBG semiconductor, an acceptor species substituting for element A will be denoted herein as $a_A$ and the acceptor species substituting for element B will be denoted as $a_B$. Similarly the donor species substituted for element A is denoted as $d_A$ and the donor substituted for element B is denoted as $d_B$.

For p-type doping of a binary $A_xB_y$, different dopant impurities can be used for co-implantation of acceptor atoms $a_A$ or/and $a_B$, and donor atoms $d_A$ or/and $d_B$ at a ratio greater than 1:1, e.g., a 2:1 ratio of acceptor $a_A$ or/and acceptor $a_B$, to donor $d_A$ or/and $d_B$ (ADA), in one region of a semiconductor sample.

For n-type doping of a binary $A_xB_y$, different dopant impurities can be used for co-implantation of donor atoms $d_A$ or/and $d_B$, and acceptor atoms $a_A$ or/and $a_B$ at a ratio greater than 1:1, e.g., a 2:1 ratio of donor $d_A$ or/and donor $d_B$, to acceptor $a_A$ or/and $a_B$ (DAD), in one region of a semiconductor sample.

The compensating impurity atoms implanted in accordance with the present invention are atoms of element A or element B, depending on which dopant elements are implanted, in order to maintain a stoichiometric or beneficial ratio of elements in the host lattice.

Implantation of compensating impurity atoms in accordance with the present invention compensates the element substituted by the implanted dopant and suppresses the formation of corresponding vacancies and vacancy complexes, which behave as carrier traps and reduce electrical carrier concentration.

For a binary semiconductor having the general formula $A_xB_y$, for example GaN or $Ga_2O_3$, which is co-doped by an acceptor "a" and a donor "d", the dose or dose ratio $D_A$ of compensating impurity atoms of element A to maintain a stoichiometric ratio is calculated by the expression:

$$D_A = \frac{x(Da_B + Dd_B)}{y} - (Da_A + Dd_A)$$

where x and y are the ratio numbers in the $A_xB_y$ formula;

$Da_B$ is the dose of a dopant atoms which becomes an acceptor while substituting for the element B;

$Da_A$ is the dose of a dopant atoms which becomes an acceptor while substituting for the element A;

$Dd_B$ is the dose of a dopant atoms which becomes donor while substituting the element B; and $Dd_A$ is the dose of a dopant atoms which becomes donor while substituting the element A.

If the calculated dose or fraction $D_A$ is <0, then compensating impurity should be element B atoms, and dose $D_B$ is calculated by the formula:

$$D_B = \frac{y(Da_A + Dd_A)}{x} - (Da_B + Dd_B).$$

Exemplary implantation schemes for a WBG or UWBG compound semiconductor $A_xB_y$ leading to improved p- or n-type conductivity including ADA and DAD doping, respectively, are shown in Tables I and II below:

TABLE I

Implant dose ratio for p-type conductivity

| Dopants | | | | Compensating atoms | |
|---|---|---|---|---|---|
| $a_A$ | $a_B$ | $d_A$ | $d_B$ | A | B |
| AB | | | | | |
| 2 | 0 | 1 | 0 | 0 | 3 |
| 2 | 0 | 0 | 1 | 0 | 1 |
| 0 | 2 | 1 | 0 | 1 | 0 |
| 0 | 2 | 0 | 1 | 3 | 0 |
| 1 | 1 | 1 | 0 | 0 | 1 |
| 1 | 1 | 0 | 1 | 1 | 0 |
| 1 | 0 | 0 | 0 | 0 | 1 |
| 0 | 1 | 0 | 0 | 1 | 0 |
| $A_2B_3$ | | | | | |
| 2 | 0 | 1 | 0 | 0 | 4.5 |
| 2 | 0 | 0 | 1 | 0 | 2 |
| 0 | 2 | 1 | 0 | 0.33 | 0 |
| 0 | 2 | 0 | 1 | 2 | 0 |
| 1 | 1 | 1 | 0 | 0 | 2 |
| 1 | 1 | 0 | 1 | 0.33 | 0 |
| 1 | 0 | 0 | 0 | 0 | 1.5 |
| 0 | 1 | 0 | 0 | 0.33 | 0 |

TABLE II

Implant dose ratio for n-type conductivity

| Dopants | | | | Compensating atoms | |
|---|---|---|---|---|---|
| $a_A$ | $a_B$ | $d_A$ | $d_B$ | A | B |
| AB | | | | | |
| 1 | 0 | 2 | 0 | 0 | 3 |
| 1 | 0 | 0 | 2 | 1 | 0 |
| 0 | 1 | 2 | 0 | 0 | 1 |
| 0 | 1 | 0 | 2 | 3 | 0 |
| 1 | 0 | 1 | 1 | 1 | 0 |
| 0 | 1 | 1 | 1 | 0 | 1 |
| 1 | 0 | 0 | 0 | 0 | 1 |
| 0 | 1 | 0 | 0 | 1 | 0 |
| $A_2B_3$ | | | | | |
| 1 | 0 | 2 | 0 | 0 | 4.5 |
| 1 | 0 | 0 | 2 | 0.33 | 0 |
| 0 | 1 | 2 | 0 | 0 | 2 |
| 0 | 1 | 0 | 2 | 2 | 0 |
| 1 | 0 | 1 | 1 | 0 | 2 |
| 0 | 1 | 1 | 1 | 0.33 | 0 |
| 0 | 0 | 1 | 1 | 0 | 0.5 |
| 0 | 0 | 1 | 0 | 0 | 1.5 |
| 0 | 0 | 0 | 1 | 0.67 | 0 |

For p-type doping of a ternary $(A_xB_{1-x})_yC_z$, different dopant impurities can be used for co-implantation of acceptor atoms $a_{AB}$ or/and $a_C$, and donor atoms $d_{AB}$ or/and $d_C$ at a ratio greater than 1:1, e.g., a 2:1 ratio of acceptor $a_{AB}$ or/and acceptor $a_C$, to donor $d_{AB}$ or/and $d_C$ (ADA), in one region of a semiconductor sample.

For n-type doping of a ternary $(A_xB_{1-x})_yC_z$, different dopant impurities can be used for co-implantation of donor atoms $d_{AB}$ or/and $d_C$, and acceptor atoms $a_{AB}$ or/and $a_C$ at a ratio greater than 1:1, e.g., a 2:1 ratio of donor $d_{AB}$ or/and donor $d_C$, to acceptor $a_{AB}$ or/and $a_C$ (DAD), in one region of a semiconductor sample.

For a ternary semiconductor having a general formula $(A_xB_{1-x})_yC_z$, for example $Ga_xAl_{1-x}N$ or $(Ga_xAl_{1-x})_2O_3$, which is co-doped by an acceptor "a" and a donor "d", the dose or dose ratio $D_{AB}$ of compensating impurity atoms of element A or/and B to maintain a stoichiometric ratio is calculated by the expression:

$$D_{AB} = \frac{y(Da_C + Dd_C)}{z} - (Da_{AB} + Dd_{AB})$$

where x, y, and z are the ratio numbers in the $(A_xB_{1-x})_yC_z$ formula;

$Da_{AB}$ is the dose of a dopant ion, which becomes an acceptor while substituting for the element A or/and B;

$Da_C$ is the dose of a dopant ion, which becomes an acceptor while substituting for the element C;

$Dd_{AB}$ is the dose of a dopant ion, which becomes donor while substituting the element A or/and B; and $Dd_C$ is the dose of a dopant ion, which becomes donor while substituting the element C.

If the calculated dose or fraction $D_{AB}$ is <0, then compensating impurity should be element C atoms, and dose Dc is calculated by the formula:

$$D_C = \frac{z(Da_{AB} + Dd_{AB})}{y} - (Da_C + Dd_C).$$

There is a possibility of forming ADA or DAD complexes when corresponding ratios between acceptors and donors are formed.

After the appropriate dosage of acceptors, donors, and compensating impurity atoms have been implanted, in the next step of the method in accordance with the present invention, the thus-implanted WBG or UWBG semiconductor material is annealed to recover the lattice structure damaged by the dopant implantation and to activate the implanted dopants by placing them and compensating impurity in corresponding substitutional sites.

In many cases, the preferred annealing process will be a non-equilibrium type of annealing such as the multicycle rapid thermal annealing (MRTA) process described in U.S. Pat. No. 8,518,808 to Feigelson et al., entitled "Defects Annealing And Impurities Activation In III-Nitride Compound" or the symmetric multicycle rapid thermal annealing (SMRTA) annealing method described in U.S. Pat. No. 9,543,168 to Feigelson et al., entitled "Defects annealing and impurities activation in semiconductors at thermodynamically non-stable conditions" and in U.S. Pat. No. 10,854,457 to Feigelson et al., entitled "Implanted Dopant Activation for III Nitride Electronics," each of which is hereby incorporated by reference into the present disclosure in its entirety.

As described in the '808 Patent, the MRTA process for annealing a dopant-implanted semiconductor consists of two separate steps taken in sequence. In the first step, the implanted semiconductor is annealed conventionally at a temperature where it is thermodynamically stable on the order of 10's of minutes. This first step partially restores the implant-induced crystal damage, which leads to a more thermodynamically stable crystal structure. The improved stability afforded by the conventional annealing step prepares the crystal lattice for the second step. Then in the second step, the dopant-implanted semiconductor is subjected to a series of multiple rapid heating pulses wherein the material is heated to temperatures above the conventional annealing temperatures to induce metastable annealing regime while accumulating sufficient total times of the semiconductor exposure to increased temperatures. The rapid heating/cooling cycles are kept very short, on the order of seconds or shorter, to maintain a metastable semiconductor structure. The SMRTA process follows the same annealing procedure as the MRTA process, but includes an additional conventional anneal after the rapid heating/cooling pulses.

A product of a new process is WBG or UWBG semiconductor with a structure determined by co-implantation and annealing, and improved p- or n-type conductivity.

Figure 3A:
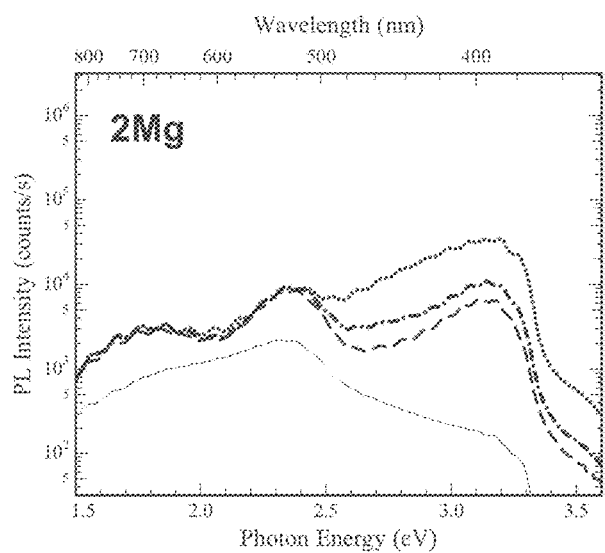
FIGS. 3A-3C are plots illustrating the improved activation yield of exemplary co-implanted and annealed samples creating ADA complexes in GaN consisting of magnesium acceptors and oxygen donors.
Figure 3B:
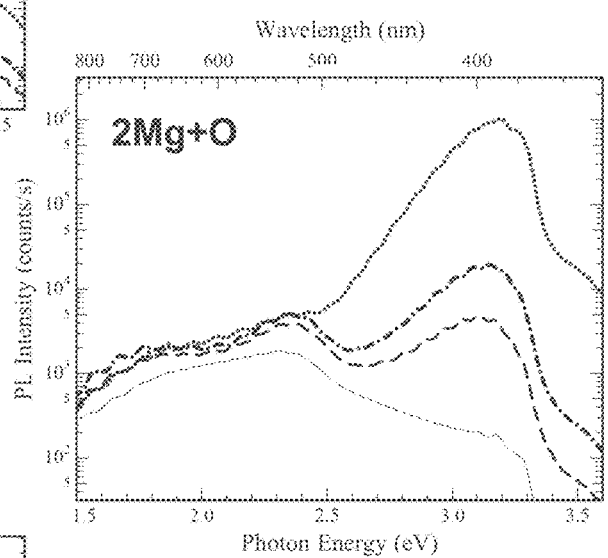
Figure 3C:
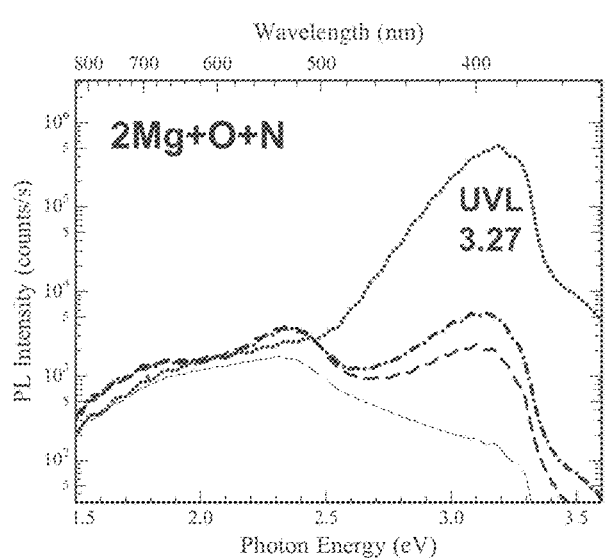

The plots in FIGS. 3A-3C illustrate ADA doping in GaN by enhanced acceptor concentration as evidenced by photoluminescence. In these photoluminescence plots, three broad signals are shown in the red, yellow/green, and UV regions where the green signal is evidence of defects and UV shows emission from recombination of acceptors. Each figure plots spectra at increasing anneal temperatures from an 80 minute long, 980° C. anneal, to a 1450° C. SMRTA, 1500° C. SMRTA, and 1550° C. SMRTA anneals.

FIG. 3A shows photoluminescence of magnesium ion implanted material exhibiting increased UV luminescence with increasing anneal temperature indicative of improved concentration of acceptors. FIG. 3B shows photoluminescence of material implanted with magnesium acceptors and oxygen donors in a 2:1 ratio exhibiting greatly enhanced UV luminescence indicative of greatly enhanced concentration of acceptors at a given anneal condition. FIG. 3C shows photoluminescence of material implanted with magnesium acceptors, oxygen donors, and nitrogen compensating atoms in the ratio of 2:1:1 to maintain stoichiometry, exhibiting reduced green luminescence, indicative of reduced defect concentrations (typically nitrogen vacancies) while maintaining greatly improved UV luminescence.

Advantages and New Features

The present invention can be used to make electronic and optoelectronic devices, which require p-type semiconductor regions in named semiconductors.

The present invention can be used to make electronic and optoelectronic devices, which require n-type semiconductor regions in named semiconductors.

The present invention can be used to make electronic and optoelectronic devices, which require p-n junctions in WBG and UWBG semiconductors.

Alternatives

In accordance with the present invention, a p-type semiconductor region can be formed in a binary $A_xB_y$ WBG or UWBG semiconductor sample by implanting specified acceptor and donor atoms at a ratio of two acceptors to one donor, plus specified amounts of compensator atoms, into the semiconductor lattice, wherein the compensator atoms completely or partially preserve the stoichiometry of the semiconductor material.

The present invention shows a methodology and example in GaN for formation of complexes leading to p-type doping in wide-bandgap and ultrawide-bandgap materials by formation of complexes of multiple atoms. Accordingly, both acceptor and donor species can be created in such semiconductors given precise control of acceptor species and concentrations, donor species and concentration, and compensating species and concentration to maintain stoichiometry and favors formation of such complexes during subsequent annealing steps via SMRTA or other relevant annealing moiety.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A semiconductor material having an area with a predetermined conductivity, comprising:
   a doped semiconductor material having an $A_xB_y$ crystal lattice structure,
   the doped semiconductor material having a predefined area that includes
      a predetermined implanted dose $Da_A$ of a first acceptor impurity $a_A$ which substitutes for element A in the $A_xB_y$ crystal lattice structure and/or a predetermined dose $Da_B$ of a second acceptor impurity $a_B$ which substitutes for element B in the $A_xB_y$ crystal lattice structure,
      a predetermined implanted dose $Dd_A$ of a first donor impurity $d_A$ which substitutes for element A in the $A_xB_y$ crystal lattice structure and/or a predetermined dose $Dd_B$ of a second donor impurity $d_B$ which substitutes for element B in the $A_xB_y$ crystal lattice structure, and
      a predetermined implanted dose $D_A$ of a compensating impurity A which represents element A in the $A_xB_y$ crystal lattice structure, a maximum implanted dose $D_A$ being determined by the formula $$D_A = \frac{x(Da_B + Dd_B)}{y} - (Da_A + Dd_A);$$

wherein the first and second acceptor impurities $a_A$ and $a_B$ and the first and second donor impurities $d_A$ and $d_B$ produces a doped area having a predetermined conductivity in the material; and
   wherein the compensating impurity A causes formation of complete $A_xB_y$ formula units in the crystal lattice structure so as to maintain a stoichiometry of the semiconductor material relative to the material's starting stoichiometry.

2. The semiconductor material according to claim 1, further including a predetermined implanted dose $D_B$ of a second compensating impurity B which represents element B in the $A_xB_y$ crystal lattice structure if the calculated $D_A$ is <0, a maximum dose $D_B$ being determined by the formula $$D_B = \frac{y(Da_A + Dd_A)}{x} - (Da_B + Dd_B).$$

3. The semiconductor material according to claim 1, wherein the semiconductor material is a binary wide-bandgap (WBG) or ultrawide-bandgap (UWBG) semiconductor.

4. The semiconductor material according to claim 3, wherein the semiconductor material is GaN, AlN, BN, or $Ga_2O_3$.

5. The semiconductor material according to claim 1, wherein the total dose $Da_A+Da_B$ of acceptor impurities is at least twice the total dose $Dd_A+Dd_B$ of donor impurities such that the implantation of acceptors and donors produces an area having p-type conductivity in the material.

6. The semiconductor material according to claim 1, wherein the total dose $Dd_A+Dd_B$ of donor impurities is at least twice the total dose $Da_A+Da_B$ of acceptor impurities such that the implantation of acceptors and donors produces an area having n-type conductivity in the material.

7. The semiconductor material sample according to claim 1, wherein the semiconductor material sample includes a first total dose $Da_A+Da_B$ of acceptor impurities and a first total dose $Dd_A+Dd_B$ of donor impurities in a first predefined area of the semiconductor material sample and a second total dose $Da_A+Da_B$ of acceptor impurities and a second total dose $Dd_A+Dd_B$ of donor impurities in a second predefined area of the semiconductor material such that the implantation of acceptors produces a predetermined area having a p-n junction in the semiconductor material.

8. A semiconductor material having an area with a predetermined conductivity, comprising:
   a doped semiconductor material having an $(A_xB_{(1-x)})_yC_z$ crystal lattice structure;
   the doped semiconductor material having a predefined area that includes
      a predetermined implanted dose $Da_{AB}$ of a first acceptor impurity $a_{AB}$ which substitutes for at least one of element A and element B in the $(A_xB_{(1-x)})_yC_z$ crystal lattice structure and/or a predetermined dose $Da_C$ of a second acceptor impurity $a_C$ which substitutes for element C in the $(A_xB_{(1-x)})_yC_z$ crystal lattice structure;
      a predetermined implanted dose $Dd_{AB}$ of a first donor impurity $d_{AB}$ which substitutes for at least one of element A and element B in the $(A_xB_{(1-x)})_yC_z$ crystal lattice structure and/or a predetermined dose $Dd_C$ of a second donor impurity $d_C$ which substitutes for element C in the $(A_xB_{(1-x)})_yC_z$ crystal lattice structure; and
      a predetermined implanted dose $D_{AB}$ of a compensating impurity A which represents element A in the $(A_xB_{(1-x)})_yC_z$ crystal lattice structure and/or a compensating impurity B which represents element B in the $(A_xB_{(1-x)})_yC_z$ crystal lattice structure, a maximum dose $D_{AB}$ being determined by the formula $$D_{AB} = \frac{y(Da_C + Dd_C)}{z} - (Da_{AB} + Dd_{AB});$$

wherein the implantation of the first and second acceptor impurities and the first and second donor impurities produces a doped area having a predetermined conductivity in the material; and
   wherein the implantation of the compensating impurity atoms causes formation of complete $(A_xB_{(1-x)})_yC_z$ formula units in the crystal lattice structure so as to maintain a stoichiometry of the semiconductor material relative to the material's starting stoichiometry.

9. The semiconductor material according to claim 8, further including a predetermined dose $D_C$ of a second compensating impurity C which represents element C in the $(A_xB_{(1-x)})_yC_z$ crystal lattice structure, a maximum dose $D_C$ being determined by the formula $$D_C = \frac{z(Da_{AB} + Dd_{AB})}{y} - (Da_C + Dd_C).$$

10. The semiconductor material according to claim 8, wherein the semiconductor material is a wide-bandgap (WBG) or ultrawide-bandgap (UWBG) semiconductor.

11. The semiconductor material according to claim 10, wherein the semiconductor material is $Ga_xAl_{1-x}N$ or $(Ga_xAl_{1-x})_2O_3$.

12. The semiconductor material according to claim 8, wherein the total dose $Da_{AB}+Da_C$ of acceptor impurities is at least twice the total dose $Dd_{AB}+Dd_C$ of donor impurities such that the implantation of acceptors and donors produces an area having p-type conductivity in the material.

13. The semiconductor material according to claim 8, wherein the total dose $Dd_{AB}+Dd_C$ of donor impurities is at least twice the total dose $Da_{AB}+Da_C$ of acceptor impurities such that the implantation of acceptors and donors produces an area having n-type conductivity in the material.

14. The semiconductor material according to claim 8, further comprising implanting a first total dose $Da_{AB}+Da_C$ of acceptor impurities and a first total dose $Da_{AB}+Da_C$ of donor impurities in a first predefined area of the semiconductor material and a second total dose $Da_{AB}+Da_C$ of acceptor impurities and a second total dose $Da_{AB}+Da_C$ of donor impurities in a second predefined area of the semiconductor material such that the implantation of acceptors produces a predetermined area having p-n junction in the material.

* * * * *